United States Patent [19]

Fong

[11] Patent Number: 5,097,444
[45] Date of Patent: Mar. 17, 1992

[54] TUNNEL EEPROM WITH OVERERASE PROTECTION

[75] Inventor: Vincent L. Fong, Fremont, Calif.

[73] Assignee: Rohm Corporation, San Jose, Calif.

[21] Appl. No.: 443,535

[22] Filed: Nov. 29, 1989

[51] Int. Cl.$^5$ ............... G11C 11/34; G11C 7/00
[52] U.S. Cl. .................. 365/185; 365/184; 365/218
[58] Field of Search ........... 365/185, 184, 94, 104, 365/218

[56] References Cited

U.S. PATENT DOCUMENTS

| | | | |
|---|---|---|---|
| 4,404,659 | 9/1983 | Kihara et al. | 365/185 |
| 4,467,453 | 8/1984 | Chiu et al. | 365/185 |
| 4,597,064 | 6/1986 | Giebel | 365/185 |
| 4,683,554 | 7/1987 | Lockwood et al. | 365/185 |
| 4,698,787 | 10/1987 | Mukherjee et al. | 365/185 |
| 4,888,734 | 12/1989 | Lee et al. | 365/185 |
| 4,905,194 | 2/1990 | Ohtsuka et al. | 365/185 |
| 4,924,438 | 5/1990 | Kobatake | 365/185 |
| 4,949,309 | 8/1990 | Rao | 365/185 |
| 4,972,371 | 11/1990 | Komori et al. | 365/185 |
| 4,992,980 | 2/1991 | Park et al. | 365/185 X |

FOREIGN PATENT DOCUMENTS

| | | | |
|---|---|---|---|
| 28875 | 2/1983 | Japan | 365/185 |
| 60266 | 3/1987 | Japan | 365/185 |

OTHER PUBLICATIONS

"A 5-V Only 256K-Bit CMOS Flash EEPROM" by D'Arrigo et al., 1989 IEEE Int'l Solid-State Circuits Conference.

*Primary Examiner*—Joseph A. Popek
*Assistant Examiner*—Michael A. Whitfield
*Attorney, Agent, or Firm*—Townsend and Townsend

[57] ABSTRACT

The present invention provides protection against the effects of overerasure while essentially maintaining a single transistor per memory cell through the use of an additional transistor for each row of memory cells. The added transistor is a positive voltage threshold device which is coupled between the connected sources of the floating gate transistors and a read input line to limit the threshold voltage. For programming, a second transistor with a negative voltage threshold is coupled in the same manner, but is coupled to a program input line. The positive threshold transistor prevents an unselected transistor from turning on during a read operation.

13 Claims, 3 Drawing Sheets

TUNNEL EEPROM WITH OVERERASE PROTECTION

BACKGROUND

The present invention relates to electrically erasable programmable read only memory (EEPROM) cells using a single transistor for the memory cell.

The number of transistors used in a memory cell has been steadily decreased through improved designs in order to improve the density on a semiconductor memory chip. EEPROM memory cells provide static memory storage through the use of a floating gate transistor. The floating gate stores charge, indicating a digital 1, or has no charge, indicating a digital zero. Typically, a second transistor is required in conjunction with the EEPROM transistor to isolate that transistor from other memory cells when a particular memory cell is being operated upon. The extra transistor is required because of the programming and erase functions which must be provided, in addition to the normal read function.

A number of designs have provided single transistor cells which rely on the Fowler-Nordheim tunneling mechanism to program and erase a floating gate transistor. Such memory cells are sometimes referred to as "flash" memory cells. One such transistor configuration is shown in U.S. Pat. No. 4,698,787, which uses hot electron injection for programming and Fowler-Nordheim tunneling for erasing. The absence of the extra isolated transistor requires certain tricks in being able to program and erase the transistor. In the embodiment shown in the '787 patent, the memory cell transistors are alternately inverted so that their drains and sources are coupled together. Another configuration discussed in a paper entitled "A 5 V-Only 256 K Bit CMOS Flash EEPROM" by Sebastiano D'Arrigo, et al. of Texas Instruments Incorporated presented at the 1989 IEEE International Solid-State Circuits Conference, describes a design which requires a complex combination of voltages for programming transistor cells without affecting previously programmed cells. This includes the biasing of non-selected word lines as well as selected word lines with different voltage levels.

A problem common to the single transistor configurations is that of "over-erasing". When the floating gate transistor is erased, applied voltages establish a strong electric field across the gate and drain regions such that electrons are removed from the floating gate of the transistor. As the electrons are removed, the threshold voltage of the cell decreases. As long as there is a positive potential from the drain to the gate, electrons will continue to be removed, causing excess electrons to be removed. Thus, instead of the floating gate going from a negative to a zero potential, the floating gate goes to a positive potential. Thus, after erasing, an inversion layer will be formed in the channel area of the transistor even though the gate is biased at zero volts. The formation of this channel turns on an unselected cell, causing current to flow, and thus an error, when attempting to read a selected cell which is turned off.

SUMMARY OF THE INVENTION

The present invention provides protection against the effects of overerasure while essentially maintaining a single transistor per memory cell through the use of an additional transistor for each row of memory cells. The added transistor is a positive voltage threshold device which is coupled between the connected sources of the floating gate transistors and a read line to limit the threshold voltage. For programming, a second transistor with a negative voltage threshold is coupled in the same manner, but is coupled to a program line.

The positive threshold transistor prevents an unselected transistor from turning on during a read operation. The positive threshold transistor has a positive voltage threshold (Vt, gate to drain voltage) of about 0.5 v to 1.0 v. The threshold of an overerased transistor will typically be approximately −2 v. The positive threshold transistor is connected in the current path between the read line and the unselected transistor, allowing it to prevent current flow since it remains turned off, avoiding a current flow error. The positive threshold transistor also fixes the voltage level at the drain of the unselected transistor, preventing the unselected transistor from turning on. The separate negative threshold transistor coupled to the source of the row of memory cells is used to provide a high voltage to the memory cell for erasing purposes.

For a fuller understanding of the nature and advantages of the invention, reference should be made to the ensuing detailed description taken in conjunction with the accompanying drawings.

DETAILED DESCRIPTION OF THE PREFERRED EMBODIMENT

Figure 1A:
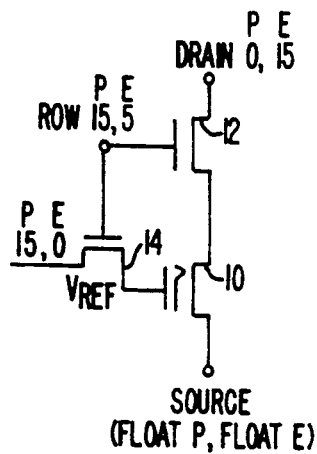
FIGS. 1A-2B are diagrams of prior art single transistor EEPROM memory cells.
Figure 1B:
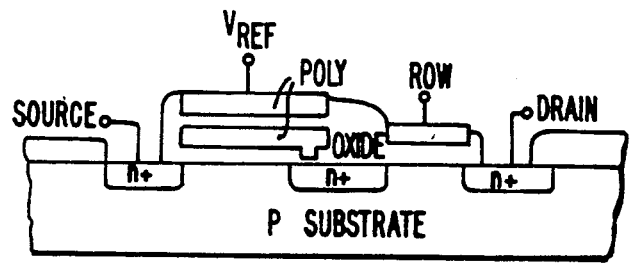

FIGS. 1A and 1B show a conventional two transistor EEPROM memory cell. The merged structure shown in FIG. 1B can be represented as three transistors in the diagram of FIG. 1A. Transistor 10 stores the memory data with adjacent transistors 12 and 14 controlling the reading and programming operations. Table I below shows the voltages used for the program and erase functions.

TABLE I

|  | Source | Vref. | Row | Drain |
|---|---|---|---|---|
| Program | float | 15 v | 15 v | 0 v |
| Erase | float | 0 v | 15 v | 15 v |

Figure 2A:
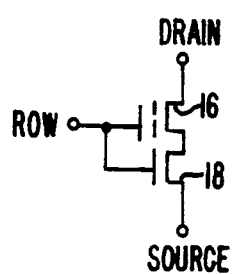
Figure 2B:
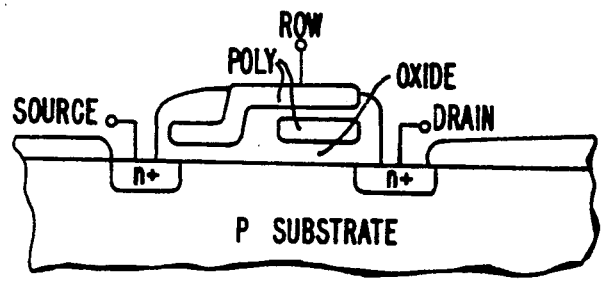

FIGS. 2A and 2B show a conventional split gate EEPROM memory cell. This memory cell can be electrically represented to two transistors 16 and 18 as shown in FIG. 2A.

During an erase mode, the 0 v applied to the Vref. of FIG. 1A is passed through transistor 14 to the gate of transistor 10. The 15 v level at the drain terminal is passed through by activated transistor 12 to the drain of transistor 10. As electrons tunnel out from the floating gate of transistor 10, the effective voltage level on the floating gate changes, giving the effect of a higher positive voltage applied and removing more electrons, ending up with a net positive charge being stored on the floating gate. This is the overerasing effect. One method of controlling this would be to monitor the voltage levels and time them so that applied erase voltages are removed before any overerasure occurs. This solution would be complicated and would require great precision, however.

Figure 3:
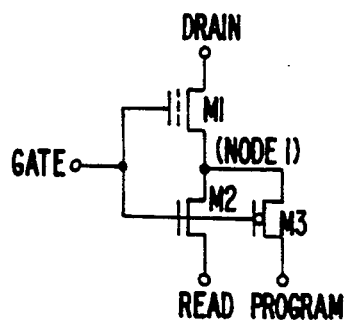
FIG. 3 is a diagram of a single memory cell according to the present invention.
Figure 4A:
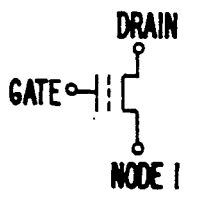
FIGS. 4A-6B are diagrams of the various transistors used in the circuit of FIG. 3.
Figure 4B:
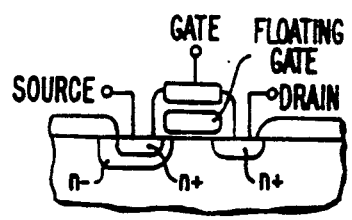
Figure 5A:
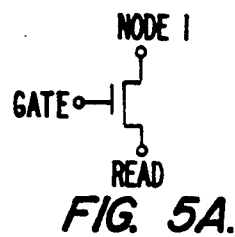
Figure 5B:
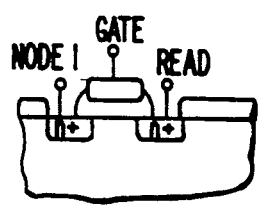

FIG. 3 is a diagram of a circuit according to the present invention showing a single EEPROM floating gate transistor M1 for storing data on a floating gate. A second transistor M2 is coupled between the source of transistor M1 (node 1) and a read line. M2 is an N-channel enhancement device with a positive voltage threshold for selecting the cell during a read operation, and is shown in FIGS. 5A and 5B in more detail. Transistor M3 is coupled between node 1 and a program input and is used to pass a high voltage to the cell for erasing purposes. The gates of all three transistors are coupled together.

Figure 6A:
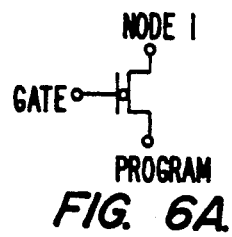
Figure 6B:
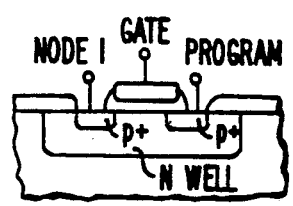

FIG. 6A shows a circuit diagram of transistor M3 of FIG. 3, with FIG. 6B showing the transistor implemented as a P-channel device.

Figure 7:
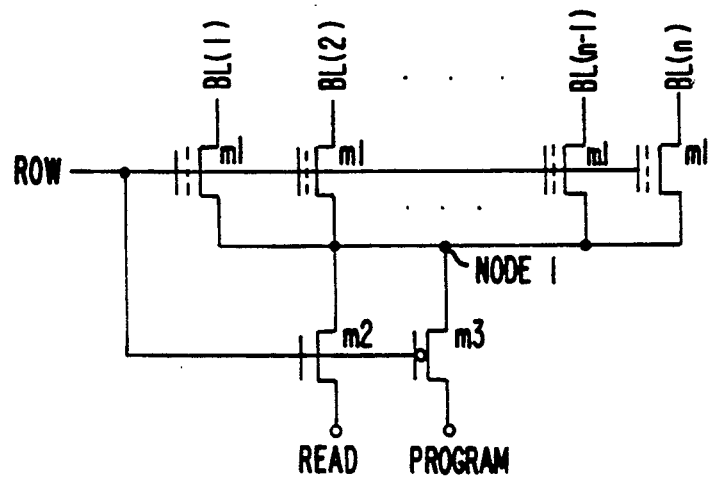
FIG. 7 is a diagram of the present invention showing an entire row.

FIG. 7 shows a row of memory cells M1 coupled to a single transistor M2 and a single transistor M3 for reading and programming.

Figure 8:
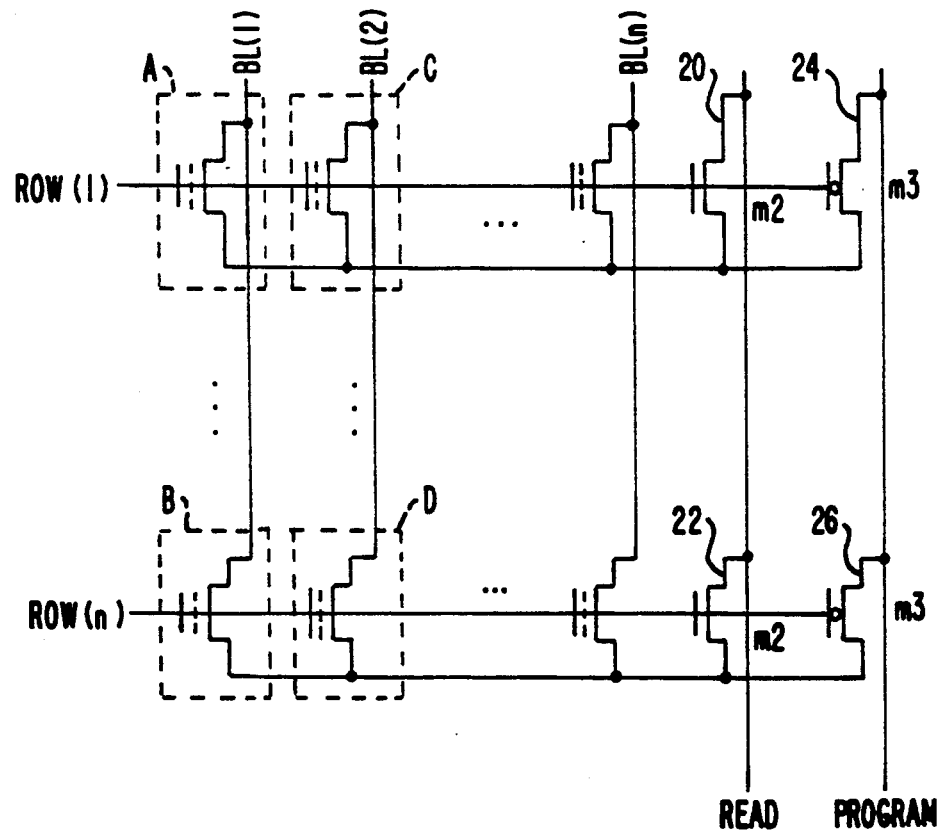
FIG. 8 is a diagram of the present invention showing a plurality of rows and columns in an array.

FIG. 8 shows an entire array, with an M2 transistor 20 for a first row and an M2 transistor 22 for row N. Similarly, there is an M3 transistor 24 for row 1 and an M3 transistor 26 for row N.

Table II below shows the voltage levels applied to the various inputs of the memory cells during read, program and erase operations. The selected cell is identified as A in FIG. 8. Three types of unselected cells are also identified, cell B (same column as selected cell), cell C (same row), and cell D (different row and column). The table shows the values where the negative threshold transistor, M3, is a P-type transistor.

TABLE II

| Mode of Operaion | Selected Cell (A) Drain:Gate:Read:Program | Unselected Cell (B,C or D) Drain:Gate:Read:Program |
| --- | --- | --- |
| Read | 1.5 v 5 v 0 v 0 v | B: 1.5 v 0 v 0 v 0 v<br>C: 0 v 5 v 0 v 0 v<br>D: 0 v 0 v 0 v 0 v |
| Program | 6.5 v 12 v 0 v 0 v | B: 6.5 v 0 v 0 v 0 v<br>C: 0 v 12 v 0 v 0 v<br>D: 0 v 0 v 0 v 0 v |
| Erase | float 0 v float 16 v | float 0 v float 0 v |

The overerasure problem arises when attempting to read transistor cell A, with the transistor of cell A being programmed to be off. Without the present invention, the transistor of cell B would be turned on if it was previously overerased due to the voltage applied to its drain, causing leakage current to flow. The combined leakage current from all the cells in the same column will make it appear that transistor A is turned on, causing an error. The M2 transistor of the present invention insures that transistor B will remain turned off. The positive threshold of transistor M2 limits the negative threshold of transistor M1 of cell B when transistor M1 of cell B receives a 1.5 v level during a read.

The description and Table II above describe an embodiment using a one transistor EEPROM cell using hot electron injection. The invention also applies to an embodiment using a traditional $E^2$ memory cell which uses electron tunneling.

Figure 9:
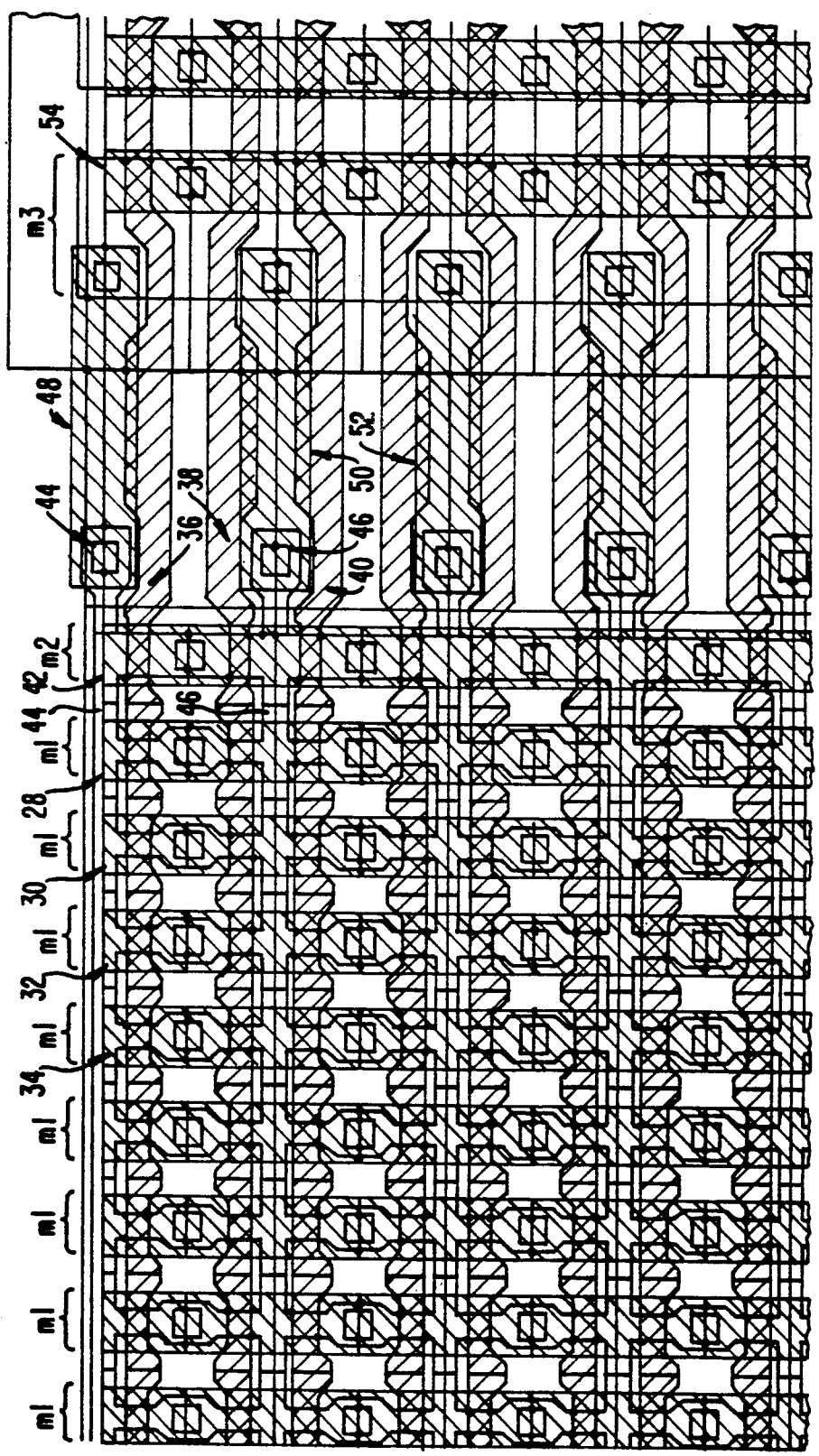
FIG. 9 is a diagram of a portion of a layout of the present invention.

As can be seen, the present invention requires the generation of voltage levels of 0 v, 1.5 v, 5.0 v, 6.5 v and 12 v. These are preferably generated from externally supplied voltages of 12 v, 5 v and 0 v using diode ladders. FIG. 9 shows a portion of a layout of a semiconductor chip with an array according to the present invention. A plurality of transistors M1 are shown having their drains connected together through metal column lines 28, 30, 32 and 34. The gates of the M1 transistors in each row are coupled together with polysilicon row lines 36, 38, and 40. These row lines are also coupled to the gates of the M2 transistors. The M2 transistors have one electrode coupled to a metal read line 42. An N+ diffusion line 44 acts as node 1 for row 1, while an N+ diffusion line 46 acts as node 1 for row 2. Transistors M3 are also connected to these node 1 lines by metal connections 48, 50 and 52, respectively. The metal connections are required to bridge the gap between the N region where the M1 and M2 transistors are located to the P region where the M3 transistors are located. The gates of the M3 transistors are coupled to the row lines, while the electrode of each of the M3 transistors not coupled to node 1 is coupled to a metal program line 54.

As can be seen, the present invention gives the ability to provide a high density memory array with a simple solution to the overerasure problem.

The M1 floating gate transistor of the present invention can be any transistor which stores data by altering its threshold voltage via "hot electron injection" or "Fowler-Nordheim tunneling" or an equivalent mechanism. M1 can be a conventional floating gate transistor, and can be made in MNOS, SNOS, SONOS, or could be a one transistor EE cell. The transistor must be erased (by removing electrons from the storage region) through the Fowler-Nordheim tunneling mechanism or an equivalent mechanism.

The programming of the cell is achieved through hot electron injection in one embodiment. In the programming mode, the cell threshold voltage is increased to approximately 6 v to turn the transistor off, and left at approximately −2 v to leave the transistor on.

As will be understood by those familiar with the art, the present invention may be embodied in other specific forms without departing from the spirit or essential characteristics thereof. For example, a standard EE cell using tunneling could be used. Accordingly, the disclosure of the preferred embodiment of the invention is intended to be illustrative, but not limiting, of the scope of the invention which is set forth in the following claims.

What is claimed is:

1. An EEPROM comprising:
    a plurality of floating gate transistors forming a row of memory cells, each floating gate transistor having a first electrode coupled to a first node and a second electrode coupled to a corresponding column line;

a positive threshold transistor having a gate coupled to a control gate of each of said floating gate transistors in said row, a first electrode coupled to said first node and a second electrode coupled to a read line; and a negative threshold transistor having a gate coupled to said control gates of said floating gate transistors, a first electrode coupled to said first node and a second electrode coupled to a program line.

2. The EEPROM of claim 1 wherein said positive threshold transistor is an N-channel enhancement transistor.

3. The EEPROM of claim 1 wherein said negative threshold transistor is a P-channel transistor.

4. The EEPROM of claim 1 wherein said first electrode of said floating gate transistors is a common N+ diffusion.

5. The EEPROM of claim 1 wherein said first electrode of said floating gate transistors is a source of said floating gate transistors.

6. The EEPROM of claim 1 further comprising means for programming one of said floating gate transistors by applying a first voltage to said read and program lines, an intermediate voltage to a drain of a selected floating gate transistor, and a first high voltage to said gates, said floating gate transistors having their sources coupled to said first node.

7. The EEPROM of claim 6 further comprising means for erasing one of said floating gate transistors by applying a high voltage to said program line with said control gates there of being grounded and said read line and a drain of each of said floating gate transistors floating.

8. The EEPROM of claim 1 wherein said floating gate transistors are programmed using hot electron injection.

9. The EEPROM of claim 1 wherein said floating gate transistors are programmed using electron tunneling.

10. An EEPROM comprising:

a plurality of floating gate transistors forming a row of memory cells, each floating gate transistor being programmable using electron tunneling, each floating gate transistor having a source which is a common N+ diffusion forming a first node and having a drain connected to a corresponding column line;

a positive threshold N-channel enhancement transistor having a gate coupled to a control gate of each of said floating gate transistors in said row, a first electrode coupled to said first node and a second electrode coupled to a read line; and a negative threshold transistor having a gate coupled to a control gate of each of said floating gate transistors, a first electrode coupled to said first node and a second electrode coupled to a program line.

11. The EEPROM of claim 10 wherein said negative threshold transistor is a P-channel transistor.

12. An EEPROM comprising:

a plurality of floating gate transistors forming a row of memory cells, each floating gate transistors being programmable using hot electron injection, each floating gate transistor having a source which is a common N+) diffusion forming a first node and having a drain connected to a corresponding column line;

a positive threshold N-channel enhancement transistor having a gate coupled to a control gate of each of said floating gate transistors in said row, a first electrode coupled to said first node and a second electrode coupled to a read line; and a negative threshold transistor having a gate coupled to a control gate of each of said floating gate transistors, a first electrode coupled to said first node and a second electrode coupled to a program line.

13. The EEPROM of claim 12 wherein said negative threshold transistor is a P-channel transistor.

* * * * *